(12) United States Patent
Park et al.

(10) Patent No.: US 6,211,013 B1
(45) Date of Patent: Apr. 3, 2001

(54) METHOD FOR FABRICATING SINGLE ELECTRON TRANSISTOR

(75) Inventors: Byung Gook Park; Dae Hwan Kim, both of Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/527,461

(22) Filed: Mar. 17, 2000

(30) Foreign Application Priority Data

Apr. 2, 1999 (KR) .................................................. 99-11619

(51) Int. Cl.$^7$ .................................................. H01L 21/336
(52) U.S. Cl. ........................... 438/257; 438/28; 438/264; 438/301
(58) Field of Search .................................. 438/257, 283, 438/264, 301

(56) References Cited

U.S. PATENT DOCUMENTS

| | | | |
|---|---|---|---|
| 5,677,637 | * 10/1997 | Nakazato et al. | 326/35 |
| 5,899,734 | * 5/1999 | Lee | 438/584 |
| 5,989,947 | * 11/1999 | Dilger et al. | 438/172 |
| 6,054,349 | * 4/2000 | Nakajima et al. | 438/257 |
| 6,069,380 | * 5/2000 | Chou et al. | 257/315 |

OTHER PUBLICATIONS

Lei Zhuang et al., "Room Temperature Silicon Single–Electron Quantum–Dot Transistor Switch," IEDM 97, pp. 167–169.
Sandip Tiwari et al., "Volatile and Non–Volatile Memories in Silicon with Nano–Crystal Storage," IEDM 95, pp. 521–524.

\* cited by examiner

*Primary Examiner*—Matthew Smith
*Assistant Examiner*—Victor V. Yevsikov
(74) *Attorney, Agent, or Firm*—Morgan, Lewis & Bockius LLP (57) ABSTRACT

A fabrication method provides a single electron transistor with a reduced quantum dot size. The method includes the steps of forming a first gate insulating film on a semiconductor substrate, implanting impurity ions into source/drain regions of the semiconductor substrate to form source/drain impurity regions, forming a lower gate on the first gate insulating film over a channel region between the source/drain impurity regions, forming a second gate insulating film on the lower gate and the first gate insulating film, forming a third insulating film on the second gate insulating film, selectively removing a portion of the third insulating film over the channel region in a direction perpendicular to a direction between the source/drain impurity regions to define a groove in the third insulating film, and forming an upper gate in the groove of the third insulating film.

8 Claims, 12 Drawing Sheets

METHOD FOR FABRICATING SINGLE ELECTRON TRANSISTOR

This application claims the benefit of Korean Patent Application No. 11619/1999, filed in Korea on Apr. 2, 1999, which is hereby incorporated by reference.

BACKGROUND OF THE INVENTION

1. Field of the Invention

The present invention relates to a single electron transistor, and more particularly, to a method for fabricating a single electron transistor in which the size of an electrically formed quantum dot is reduced.

2. Discussion of the Related Art

Figure 1:
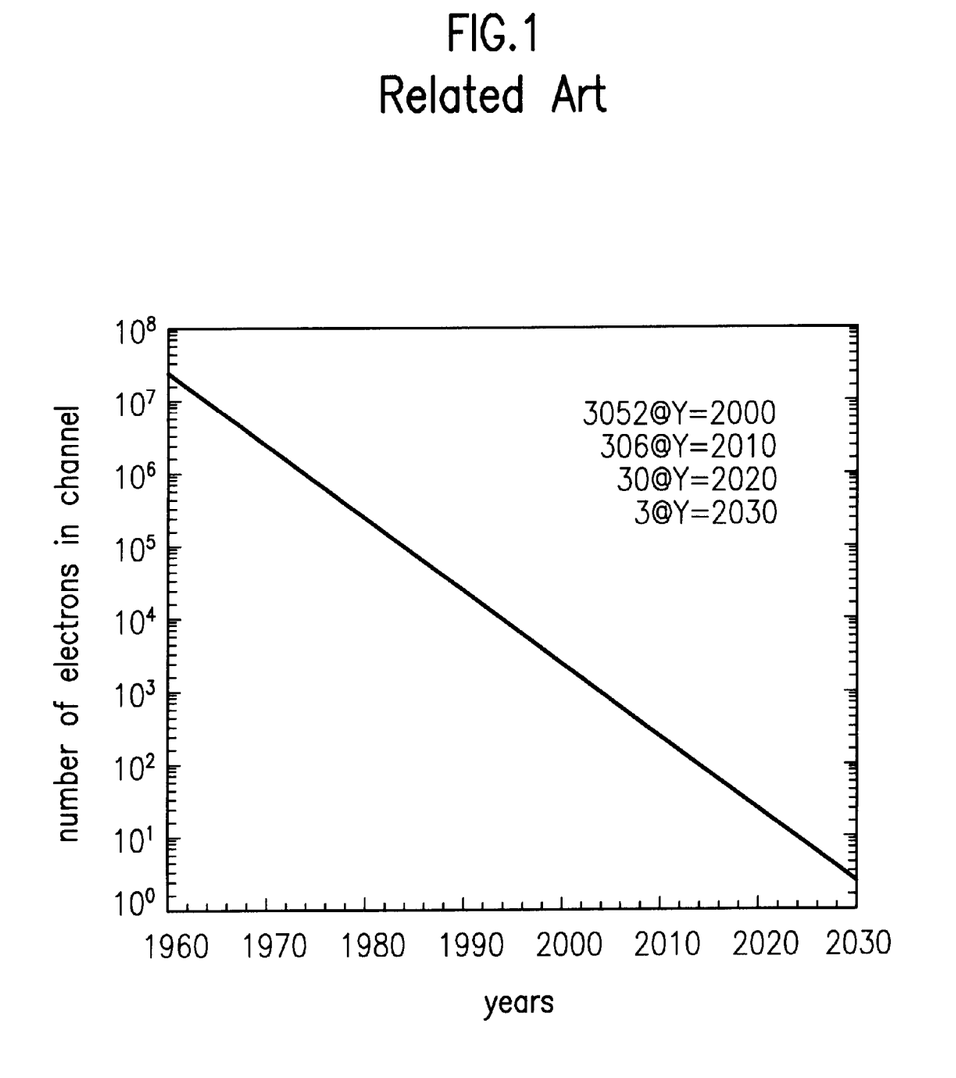
FIG. 1 is a graph showing the projected numbers of electrons required for device operation according to an experimental scale-down trend of MOSFETs.
Figure 2:
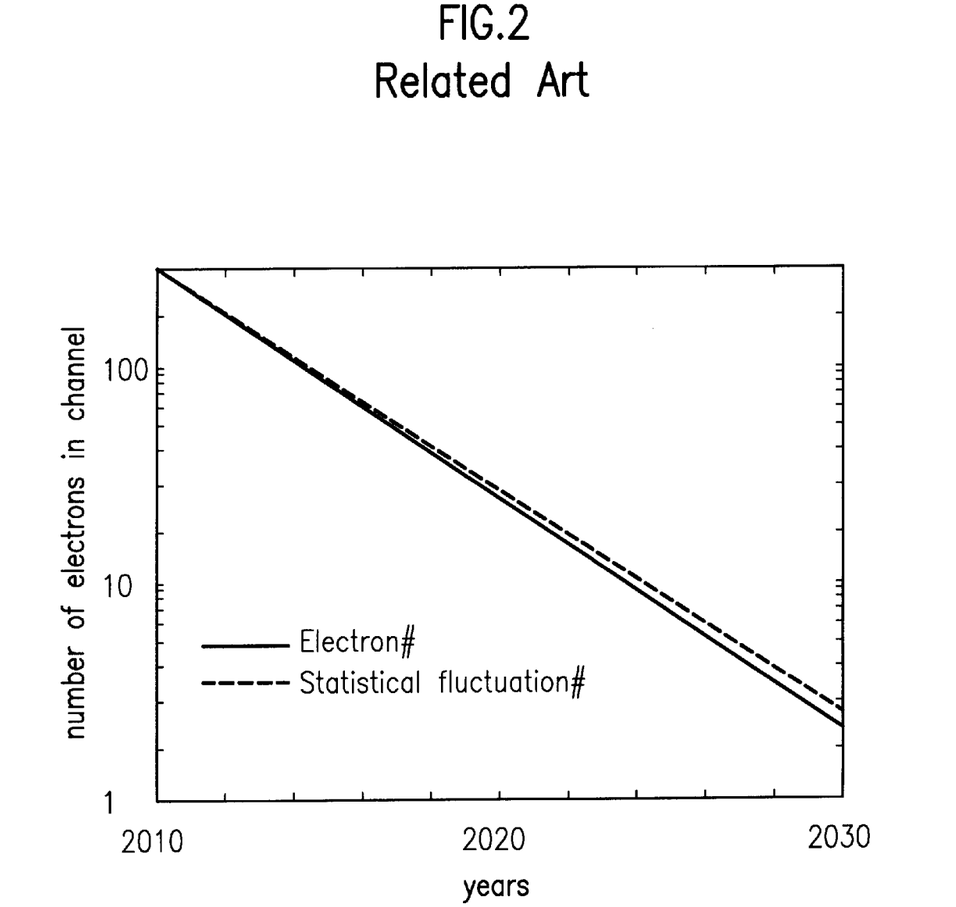
FIG. 2 is a graph showing device reliability degradation for the experimental scale-down trend of MOSFETs.

There has been a tremendous trend in the semiconductor industry over the years to reduce device size. To illustrate this trend, FIG. 1 provides a graph reflecting the trend in the reduction of the numbers of electrons required for device operation according to an experimental scale-down rule of MOSFETs. FIG. 2 provides a graph showing device reliability degradation according to the experimental scale-down rule of MOSFETs of FIG. 1.

Referring to FIG. 1, the present scale-down trend indicates that if the high density device packing of MOSFETs continues, the number of electrons present in a channel will be reduced from approximately 300 in year 2010 to no more than approximately 30 in year 2020. As shown in FIG. 2, if the number of electrons for operating a device is reduced, a ratio of the statistical variation in the number of electrons which falls to the total number of electrons involved in device operation will gradually increase. Thus, a serious influence on device operation reliability will be raised, and a new device structure will be required to precisely control a single electron. To overcome the limitations arising from the high density integration of MOSFETs, a single electron transistor recently was suggested. The single electron transistor can control a single electron and can operate at a very low voltage. However, a single electron transistor requires difficult technology to form a quantum dot between a few nanometers and tens of nanometers at a specific, highly reproducible position for room temperature operation. Particularly, in order to form a single electron switch, a technology is essential to form one or two quantum dots at a desired position in a desired size rather than a technology to form numerous quantum dots at a high concentration. Therefore, lithography techniques are required to form quantum dots with controllability, reproducibility, and reliability. A minimum line width available with present photolithography techniques in semiconductor processes is about 0.2 $\mu$m (or 200 nanometers). Therefore, to form a pattern with finer line widths, e-beam direct writing is employed; however this causes problems due to proximity effects. Thus, lines and spaces of desired sizes are difficult to obtain.

Figure 3:
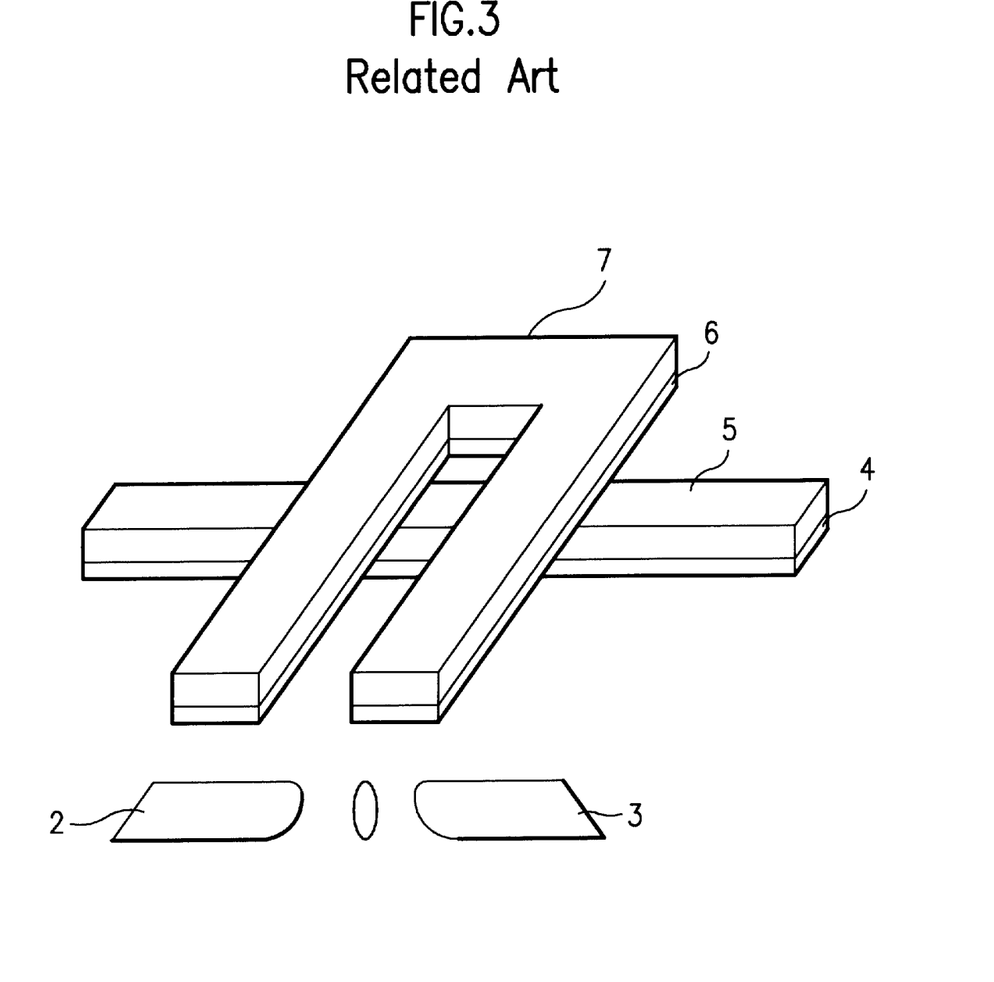
FIG. 3 is a perspective view of a related art single electron transistor.

FIG. 3 is a perspective view of a related art single electron transistor, and FIGS. 4A–4D are sectional views showing the steps of a related art method for fabricating the single electron transistor of FIG. 3. In the fabrication of the single electron transistor of FIG. 3, quantum dots are defined between two tunnel junctions. However, there have been few experimentally operative single electron transistors at room temperature to date because the necessary quantum dot sizes have relied on accidental effects (for example, polysilicon graining or e-beam irregularity). As a result, those technologies are impracticable for fabricating an integrated circuit. Alternatively, the single electron transistor can be formed by lithography to assure reproducibility in forming quantum dots electrically. FIG. 3 illustrates one of the cases suggested in 1994 in Japan.

Figure 4A:
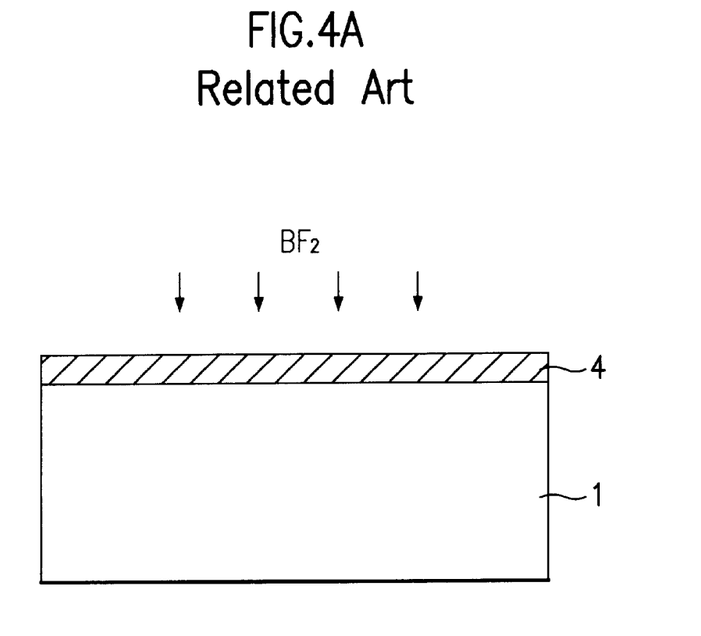
FIGS. 4A–4D are sectional views showing a related art fabrication method for a single electron transistor.
Figure 4B:
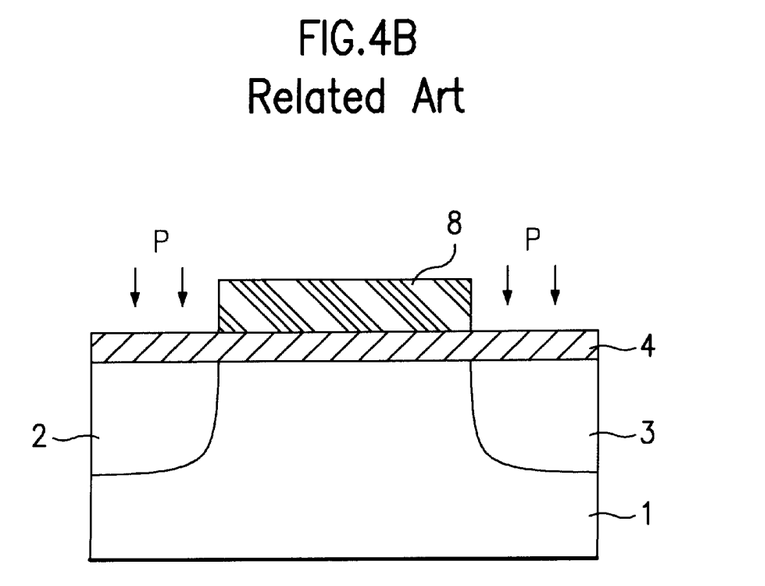
Figure 4C:
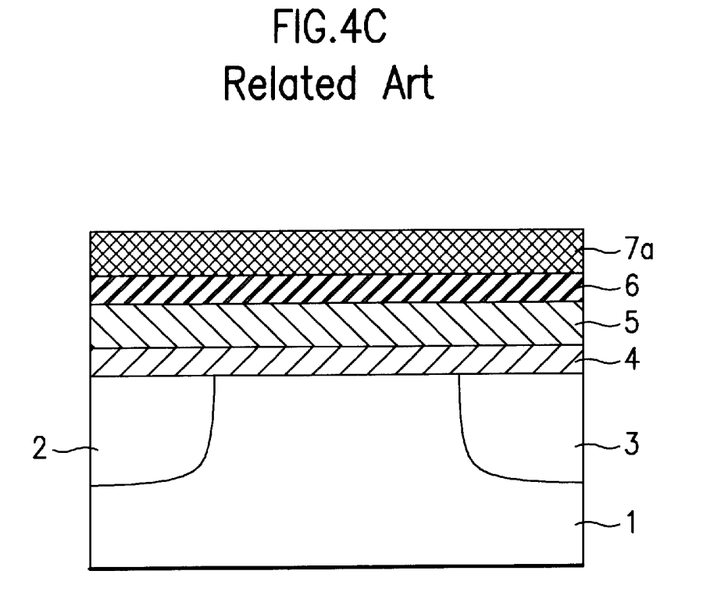
Figure 4D:
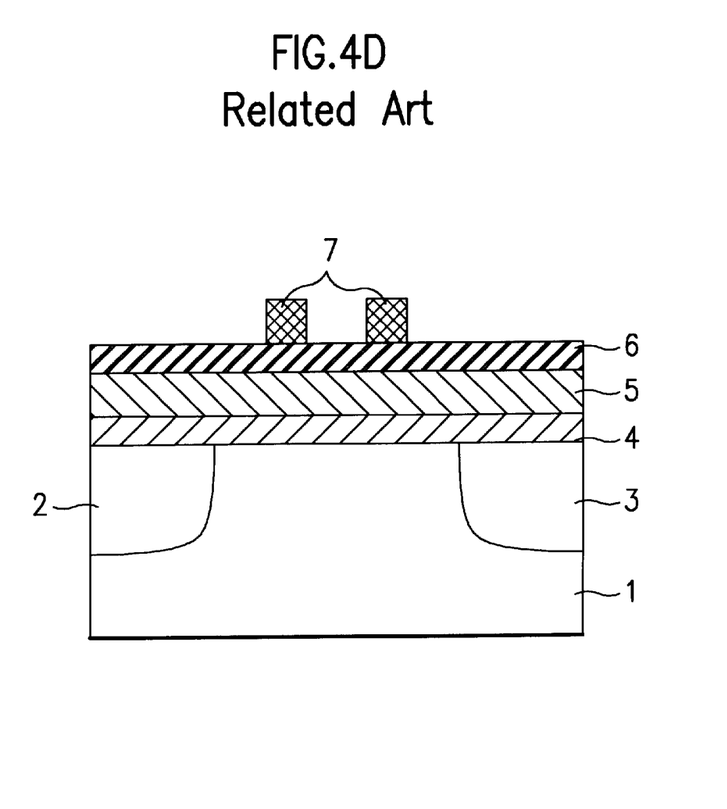

Referring to FIGS. 3 and 4D, the related art single electron transistor includes an nMOSFET structure having a first insulating film 4 formed on a semiconductor substrate 1 (not shown in FIG. 3), a lower gate 5 with a small width formed on the first gate insulating film 4, and n type source/drain impurity regions 2 and 3 formed in the semiconductor substrate in a longitudinal direction of the lower gate 5. In addition, a second gate insulating film 6 is formed on an entire surface of the substrate having the nMOSFET formed thereon, and a "U" shaped upper gate 7 is formed on the second gate insulating film 6.

A related art method for fabricating a single electron transistor will now be explained with reference to FIGS. 4A–4D.

Referring to FIG. 4A, a first insulating film 4 of silicon oxide is formed on a semiconductor substrate 1 and $BF_2$ ions are implanted into insulating film 4 to adjust a threshold voltage. As shown in FIG. 4B, a photoresist film 8 is deposited on the first gate insulating film 4 and patterned by exposure and development to define source/drain regions. Then, the patterned photoresist film 8 is used as a mask during implantation of N type impurity ions (P) to form the source/drain impurity regions 2, 3. As shown in FIG. 4C, the photoresist film 8 is removed, and polysilicon is deposited on an entire surface. Then, the polysilicon is selectively removed to leave the polysilicon in a source/drain 2 and 3 direction, thereby forming a lower gate 5. Next, a second gate insulating film 6 of silicon oxide is deposited on an entire surface including the lower gate 5, and polysilicon 7a is deposited on the second gate insulating film 6. As shown in FIG. 4D, resist (not shown in the drawing) is deposited on the polysilicon 7a, and subjected to e-beam direct writing and etching selectively to remove the polysilicon 7a, thereby forming an upper gate 7. Here, the upper gate 7 includes two portions formed on the second gate insulating film 6 between the source/drain impurity regions 2, 3 in a direction perpendicular to the lower gate 5. That is, the upper gate 7 is designed to define a quantum dot in a channel region between the two portions of the upper gate 7. Preferably, the gap between the two portions of the upper gate 7 should be very small. Also, because the two pieces of the upper gate 7 will have identical voltages applied thereto, ends of the two portions are connected to each other to form a "U" shape.

The operation of the related art single electron transistor will now be explained.

Upon application of a positive voltage to the lower gate 5, a narrow channel that conforms to a quantum wire is formed between the source/drain impurity regions 2 and 3. Then, a negative voltage is applied to the upper gate 7. Because the application of the negative voltage to the two portions of the upper gate 7 forms two potential barriers at a center of the narrow channel region under the upper gate 7, an electrical quantum dot is formed in the channel region between the two pieces of the upper gate 7. Next, the quantum dot formed in the channel region between the upper gate 7 controls the single electron tunneling, thereby operating as a single electron transistor.

Figure 5A:
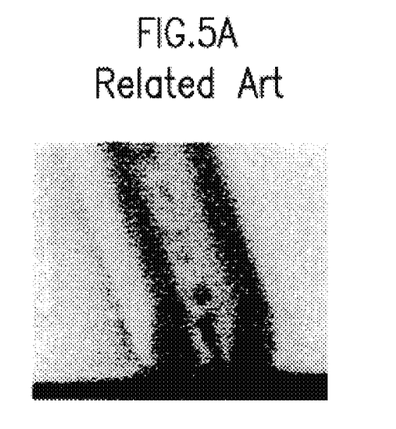
FIGS. 5A–5C are SEMs of upper gate patterns formed by e-beam direct writing according to a related art fabrication method for a single electron transistor.
Figure 5B:
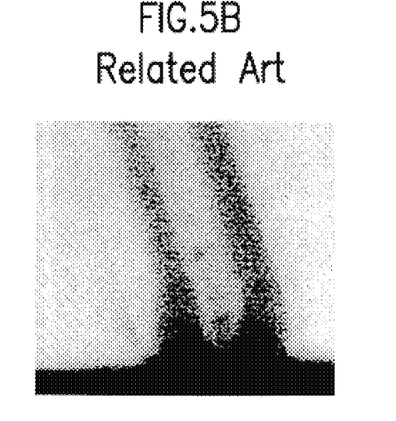
Figure 5C:
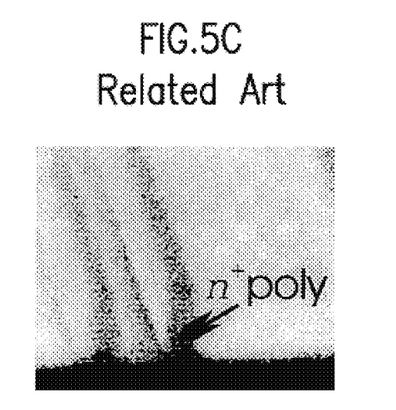

However, the related art single electron transistor has a number of fabrication problems. FIGS. 5A–5C are SEMs of upper gate patterns formed by the E-beam direct writing in the related art fabrication method for a single electron transistor. For an electrical signal from a single electron tunneling to overcome thermal noise and be a main signal, a charging energy of one electron, $q^2/2C$, should be sufficiently larger than a thermal energy, $K_BT$. Here, q denotes an electron charge, and C denotes a capacitance of the quantum dot. Therefore, the capacitance of the quantum dot for stable room temperature operation must be $1.2 \times 10^{-17}$ or less. This value has been experimentally obtained from a period of oscillation of a single electron tunneling current caused by a voltage applied of approximately 13.8 mV to the lower gate. In this instance, the gap between the two pieces of the upper gate was 0.1 µm (which is limited by present photolithography). However, in the process of FIG. 4D, it is impossible to obtain two lines with the gap of 0.1 µm using e-beam direct writing with reproducibility if the process relies on present e-beam lithography because of the proximity effect in which an electron beam cannot propagate with perfect anisotropy.

A result of the experiment is shown in FIGS. 5A–5C. FIG. 5A illustrates a result of an e-beam direct writing for the upper gate with a line width of 0.33 µm and the gap between the two pieces of the upper gate of 0.178 µm. FIG. 5B illustrates a result of an e-beam direct writing for the upper gate with the line width of 0.38 µm and the gap between the two pieces of the upper gate of 0.23 µm. FIG. 5C illustrates a result of an e-beam direct writing for the upper gate with the line width of 0.24 µm and the gap between the two pieces of the upper gate of 0.218µm. As can be recognized from the above results, if both the line width and the gap approach 0.1 µm in formation of the upper gate pattern, an exact upper gate pattern cannot be formed due to the proximity effect. Therefore, the gap between the two pieces of the upper gate, which determines a size of an electrically formed quantum dot, cannot be formed smaller than the limit of the electron beam lithography and cannot be free from cryogenic operation.

SUMMARY OF THE INVENTION

Accordingly, the present invention is directed to a method for fabricating a single electron transistor that substantially obviates one or more of the problems due to limitations and disadvantages of the related art.

An object of the present invention is to provide a method for fabricating a single electron transistor that overcomes the limitations of electron beam lithography to obtain smaller line width and gap, thereby reducing a size of an electrically formed quantum dot down to a few tens of nanometers.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a single electron transistor includes the steps of forming a first gate insulating film on a semiconductor substrate, implanting impurity ions into source/drain regions of the semiconductor substrate to form source/drain impurity regions, forming a lower gate on the first gate insulating film over a channel region between the source/drain impurity regions, forming a second gate insulating film on the lower gate and the first gate insulating film, forming a third insulating film on the second gate insulating film, selectively removing a portion of the third insulating film over the channel region in a direction perpendicular to a direction between the source/drain impurity regions to define a groove in the third insulating film, and forming an upper gate in the groove of the third insulating film.

In another aspect, a single electron transistor includes a semiconductor substrate, a first gate insulating film on the semiconductor substrate, impurity ions implanted into source/drain regions of the semiconductor substrate to form source/drain impurity regions, a lower gate formed on the first insulating film over a channel region between the source/drain impurity, a second gate insulating film formed on the lower gate and the first gate insulating film, a third insulating film formed on the second gate insulating layer, the third insulating film defining a groove therein over the channel region in a direction perpendicular to a direction between the source/drain impurity regions, and an upper gate formed in the groove in the direction perpendicular to the direction between the source/drain impurity regions, wherein the upper gate having polysilicon sidewalls respectively abut the third insulating layer and being separated by a gap.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 6A:
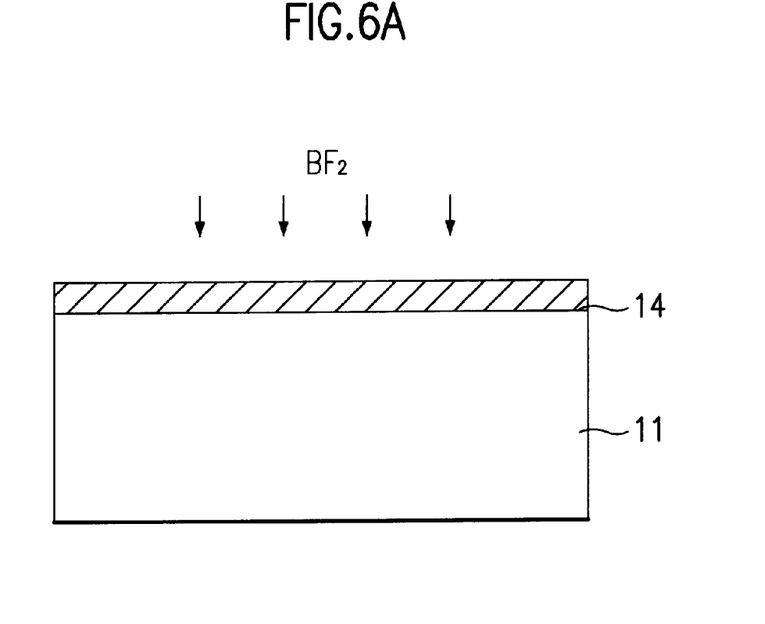
FIGS. 6A–6E are sectional views of a fabrication method for a single electron transistor in accordance with an embodiment of the present invention.
Figure 6B:
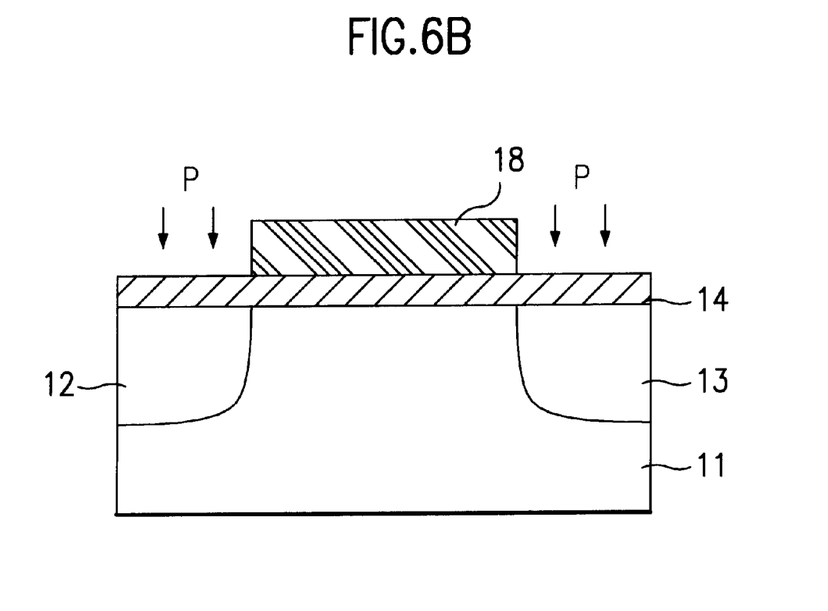

FIGS. 6A–6E illustrate a fabrication method for a single electron transistor in accordance with an embodiment of the present invention. Referring to FIG. 6A, a first gate insulating film 14 of silicon oxide is formed on the semiconductor substrate 11 and $BF_2$ ions are implanted into the substrate to adjust a threshold voltage. As shown in FIG. 6B, a photoresist film 18 is deposited on the first gate insulating film 14 and patterned by exposure and development to define source/drain regions. The patterned photoresist film 18 is then used as a mask to inject N-type impurity ions (P) into the semiconductor substrate 11, thereby forming source/drain impurity regions 12, 13.

Figure 6C:
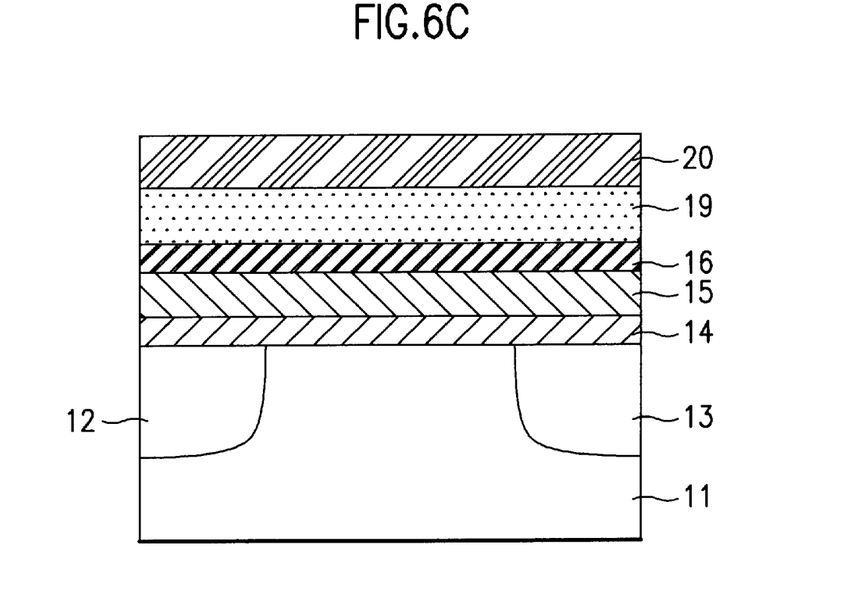

As shown in FIG. 6C, the photoresist film 18 is removed, and polysilicon is deposited on an entire surface and selectively removed to leave the polysilicon in a direction of the source/drain impurity regions 12, 13 to form a lower gate 15. TEOS (Tetra Ethyl Ortho Silicate) or silicon oxide is deposited on the resulting surface of the substrate including the lower gate 15 to form a second gate insulating film 16. Then, a third insulating film 19 of nitride or the like is deposited, and a positive photoresist film 20 is deposited on the third insulating film 19. The third insulating film 19 and the positive photoresist film 20 are patterned by e-beam direct writing. To improve the endurance of the second gate insulating film 16 during etching of the third insulating film 19 in the steps to follow, the second gate insulating film 16 can be annealed before formation of the third insulating film 19 to make the second insulating film denser.

Figure 6D:
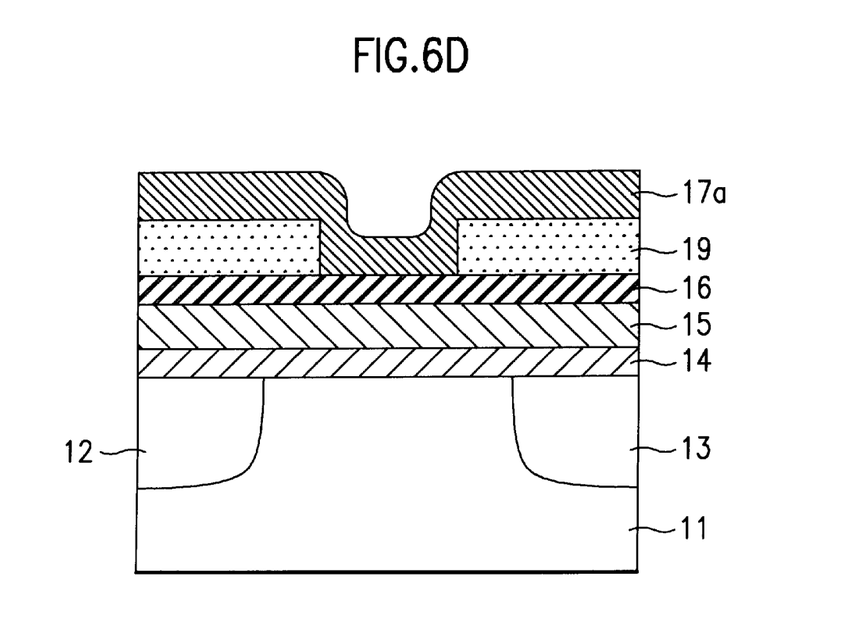

As shown in FIG. 6D, e-beam direct writing and plasma etching are used to selectively remove a portion of the third insulating film 19 where an upper gate is to be formed, thereby forming a groove. Polysilicon 17a is deposited on the resulting surface to form the upper gate.

In FIG. 6C, the photoresist film 20 is preferably formed of KrF to provide superior characteristics as an etching mask in conjunction with a plasma enhanced chemical deposition (PECVD) oxide film, as compared to alternatives such as PMMA. Here, a PECVD oxide film is deposited on the third insulating film 19. Then, a KrF resist is formed on the PECVD oxide film. The KrF resist is patterned by directing an electron beam to the portion at which the groove is intended. Thus, the PECVD film is patterned, and the third insulating film 19 is selectively removed using the remaining PECVD as a mask to form the groove of FIG. 6D.

Figure 6E:
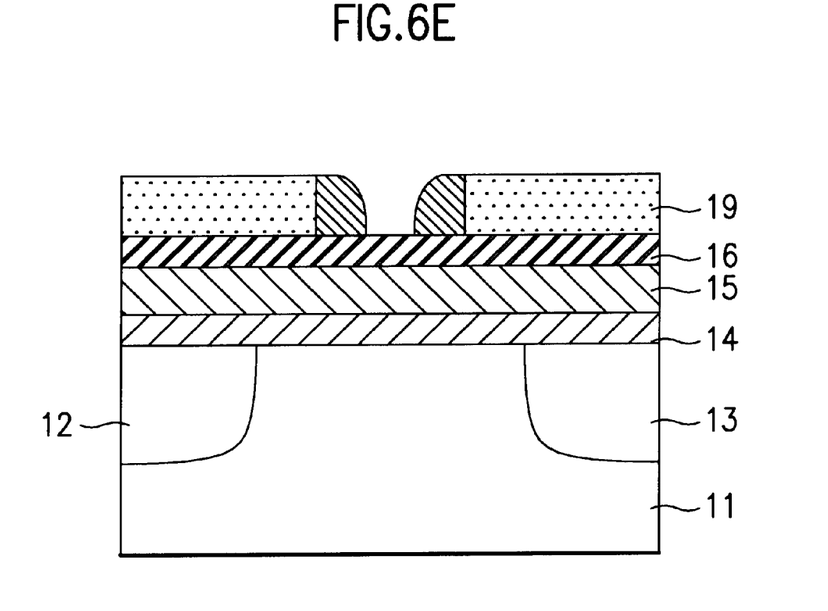

As shown in FIG. 6E, the polysilicon 17a of FIG. 6D is anisotropically etched to form the upper gate 17 at both sides of the groove. Here, two portions of the upper gate 17 are formed in a direction perpendicular to the lower gate 15. The polysilicon 17a may be doped with $POCl_3$ after anisotropically etching the polysilicon 17a for better sustainment of a sidewall and for better endurance during the etching.

Figure 7:
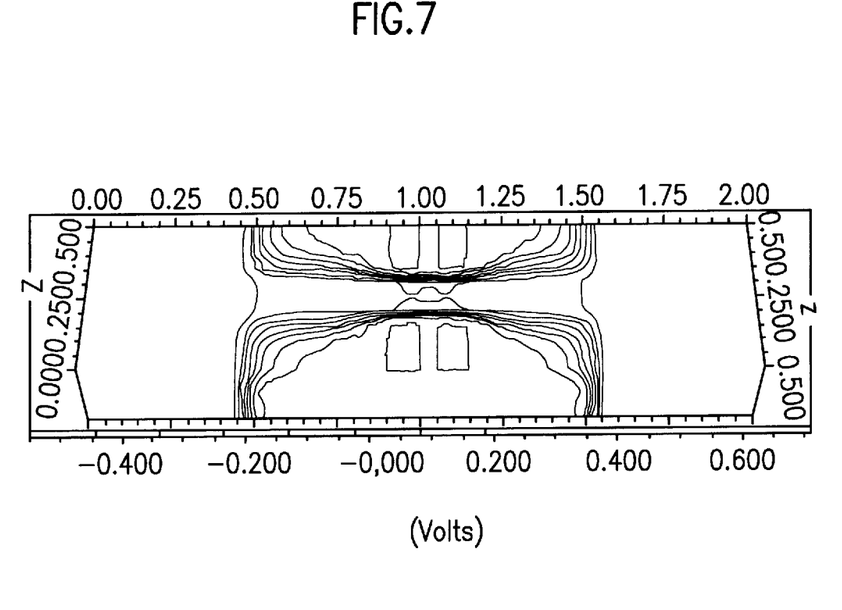
FIG. 7 illustrates a potential distribution calculated from 3D device simulation in a single electron transistor according to the present invention with an upper gate gap of 50 nm.
Figure 8:
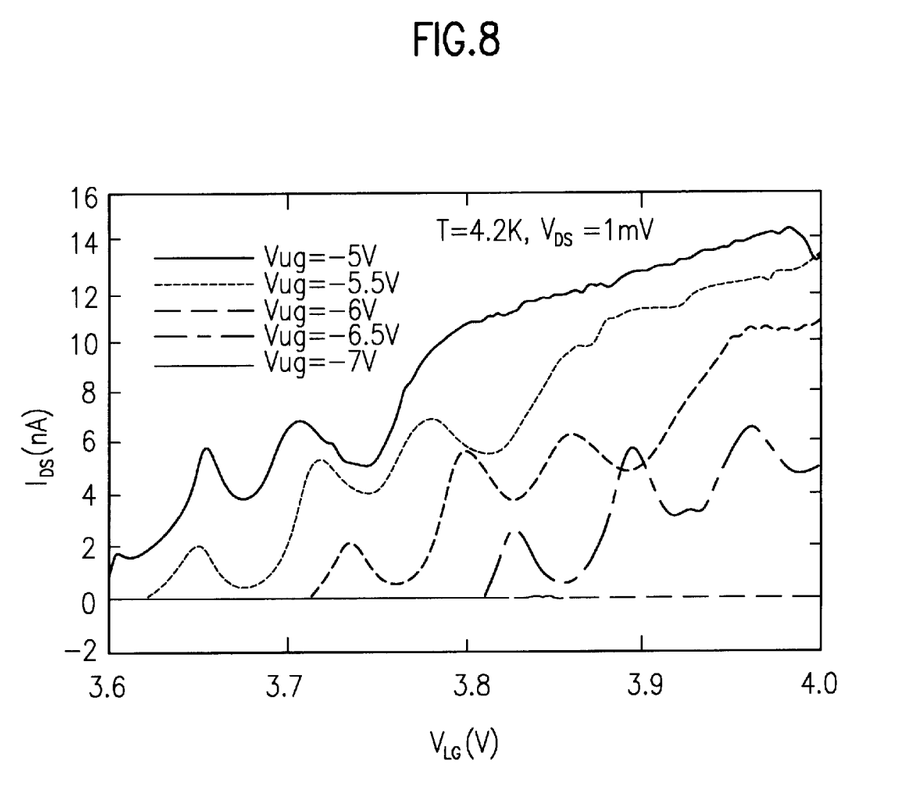
FIG. 8 is a graph showing single electron switching current versus gate voltage in a single electron transistor according to the present invention at a temperature of 4.2 K.
Figure 9:
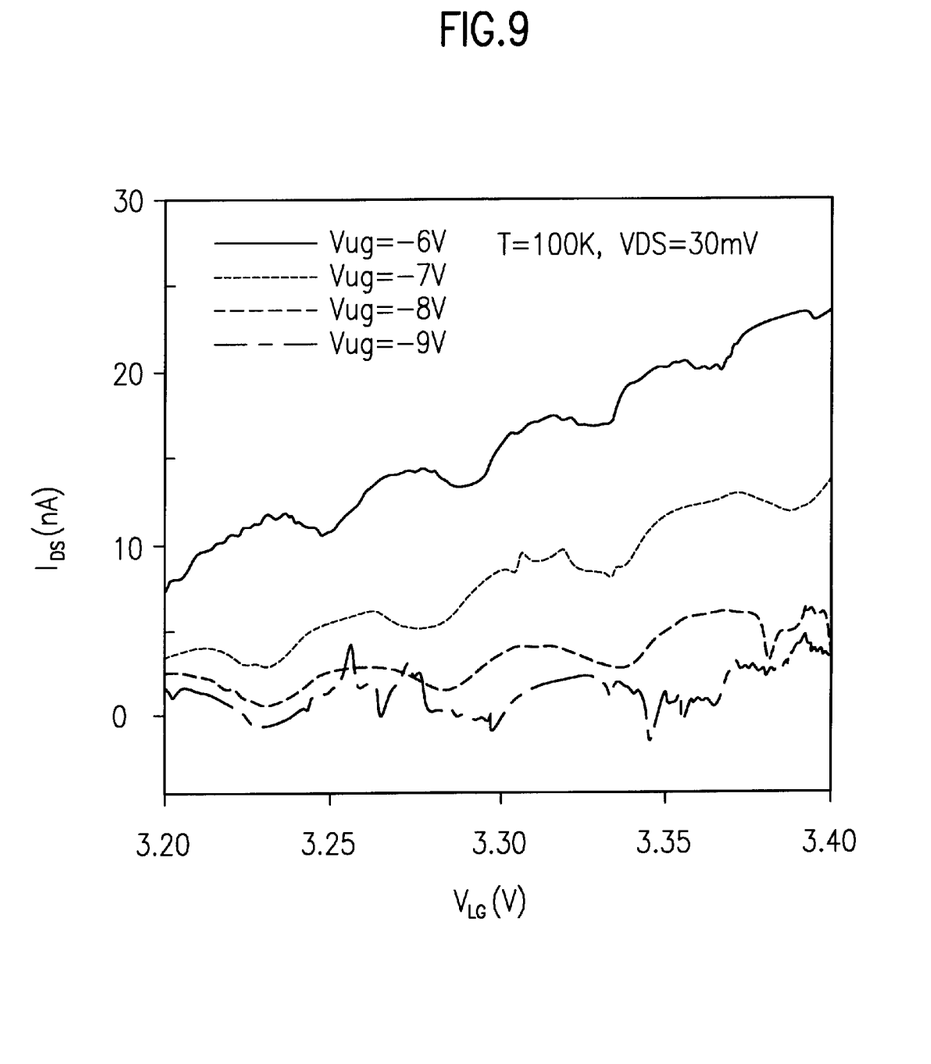
FIG. 9 is a graph showing single electron switching current versus gate voltage in a single electron transistor according to the present invention at a temperature of 100 K.

As has been explained, the fabrication method for a single electron transistor has a number of advantages. Some of the advantages will now be explained in detail with reference to FIGS. 7–9. FIG. 7 shows a potential distribution calculated from 3D device simulation for a single electron transistor with an upper gate gap of 50 nm according the present invention. FIG. 8 is a graph of single-electron switching current versus gate voltage in a single electron transistor at a temperature of 4.2 K according to the present invention. FIG. 9 is a graph of single electron switching current versus a gate voltage in a single electron transistor at a temperature of 100 K according to the present invention.

FIG. 7 shows a 3D simulation predicting the shape of a quantum dot formed when the upper gate has a gap of 50 nm. Since an electrical quantum dot is defined by an electric field defined by the upper gate voltage, the size of the quantum dot is reduced by more than 50% as compared to those of the related art. That is, the technique of the present invention reliably achieves upper gate gaps less than 50 nm.

Moreover, as can be recognized from FIGS. 8 and 9, switching characteristics of electrons according to the gate voltage are achieved at a temperatures up to 100 K, and, as determined from the switching period, a capacitance between the quantum dot and the lower gate is $3.2 \times 10^{-18}$ F. As shown in FIG. 8, the single electron transistor of the present invention exhibits a switching period in a range of 50 mV at a cryogenic temperature of 4.2 K which implies a quantum dot capacitance of $3.2 \times 10^{-18}$ F. Also, as shown in FIG. 9, the single electron transistor of the present invention exhibits a switching period in a range of 50 mV at a temperature of 100 K. Therefore, the single electron transistor of the-present invention operates at a temperature of 100 K. In comparison, the related art single electron transistor operates only at a cryogenic temperatures of 4.2 K or lower. Thus, by forming the upper gate using sidewalls, the size of quantum dot can be reduced.

It will be apparent to those skilled in the art that various modifications and variations can be made in the method for fabricating a single electron transistor of the present invention without departing from the spirit or scope of the invention. Thus, it is intended that the present invention cover the modifications and variations of this invention provided they come within the scope of the appended claims and their equivalents.

What is claimed is:

1. A method for fabricating a single electron transistor on a semiconductor substrate, the method comprising the steps of:

forming a first gate insulating film on the semiconductor substrate;

implanting impurity ions into source/drain regions of the semiconductor substrate to form source/drain impurity regions;

forming a lower gate on the first gate insulating film over a channel region between the source/drain impurity regions;

forming a second gate insulating film on the lower gate and the first gate insulating film;

forming a third insulating film on the second gate insulating film;

selectively removing a portion of the third insulating film over the channel region in a direction perpendicular to a direction between the source/drain impurity regions to define a groove in the third insulating film; and forming an upper gate in the groove of the third insulating film.

2. The method according to claim 1, wherein the selectively removing step includes e-beam direct writing to selectively remove a portion of the third insulating film.

3. The method according to claim 2, wherein the selectively removing step includes coating a KrF resist on the third insulating film before directing an electron beam to the third insulating film to form the groove using the e-beam direct writing.

4. The method according to claim 1, wherein the first and second gate insulating films includes an oxide, and the third insulating film includes a nitride.

5. The method according to claim 1, wherein the selectively removing step includes the steps of:

depositing a plasma enhanced chemical vapor deposition (PECVD) oxide film on the third insulating film;

forming a KrF resist on the PECVD oxide film;

directing an electron beam to a portion of the KrF resist to pattern the KrF resist;

selectively removing the PECVD oxide film using the patterned KrF resist as a mask; and removing the portion of the third insulating film using the PECVD oxide film as a mask to form the groove.

6. The method according to claim 1, wherein the step of forming the upper gate includes the steps of:

depositing polysilicon on the third insulating film and in the groove formed in the third insulating film;

doping the polysilicon with $POCl_3$; and subjecting the polysilicon to anisotropic etching to form polysilicon sidewalls at both sides of the groove.

7. The method according to claim 1, wherein the step of forming the upper gate includes the steps of:

depositing polysilicon on the third insulating film and in the groove formed in the third insulating film; and subjecting the polysilicon to anisotropic etching to form polysilicon sidewalls at both sides of the groove to abut the third insulating layer, the polysilicon sidewalls being formed in a direction perpendicular to the channel region and separated by a gap.

8. The method according to claim 1, further comprising the step of heat treating the second gate insulating film before forming the third insulating film.

* * * * *